United States Patent
Nakayama et al.

(10) Patent No.: US 8,541,925 B2
(45) Date of Patent: Sep. 24, 2013

(54) PIEZOELECTRIC ELEMENT DRIVING CIRCUIT

(75) Inventors: Yoshinobu Nakayama, Tokyo (JP); Takahiro Imai, Tokyo (JP)

(73) Assignee: Ricoh Company, Limited, Tokyo (JP)

( * ) Notice: Subject to any disclaimer, the term of this patent is extended or adjusted under 35 U.S.C. 154(b) by 432 days.

(21) Appl. No.: 13/039,226

(22) Filed: Mar. 2, 2011

(65) Prior Publication Data

US 2011/0223044 A1     Sep. 15, 2011

(30) Foreign Application Priority Data

Mar. 9, 2010   (JP) ................................. 2010-052378

(51) Int. Cl.
   *H01L 41/09*   (2006.01)
(52) U.S. Cl.
   USPC ....................................................... 310/317
(58) Field of Classification Search
   USPC ............... 310/316.01, 316.03, 317; 604/151, 604/611
   See application file for complete search history.

(56) References Cited

U.S. PATENT DOCUMENTS 5,422,804 A * 6/1995 Clark .............................. 363/44

FOREIGN PATENT DOCUMENTS

| JP | 8-261157 A | 10/1996 |
|---|---|---|
| JP | 11-137675 A | 5/1999 |
| JP | 11-137681 A | 5/1999 |
| JP | 2002-218772 A | 8/2002 |
| JP | 2004-532670 A | 10/2004 |
| JP | 2005-507757 A | 3/2005 |
| WO | WO 02/068015 A2 | 9/2002 |
| WO | WO 03/039631 A1 | 5/2003 |
| WO | WO 2010/016599 A1 | 2/2010 |

* cited by examiner

*Primary Examiner* — Thomas Dougherty
(74) *Attorney, Agent, or Firm* — Dickstein Shapiro LLP

(57) ABSTRACT

A transformer T1 receives a sinusoidal signal on the primary side. The transformer T1 is provided with a terminal 3, a terminal 5, and a center tap 4 on the secondary side. The center tap 4 is connected to the anode of a diode D1. The cathode of the diode D1 is connected to the cathode of a diode D2 and one electrode of a capacitor C1. The other electrode of the capacitor C1 is connected to the anode of a diode D3 and a connection point of the second electrode of a piezoelectric element C2 and the first electrode of a piezoelectric element C3. The second electrode of the piezoelectric element C3 is connected to the terminal 3. The first electrode of the piezoelectric element C2 is connected to the cathode of the diode D3, the anode of the diode D2, and the terminal 5.

6 Claims, 12 Drawing Sheets

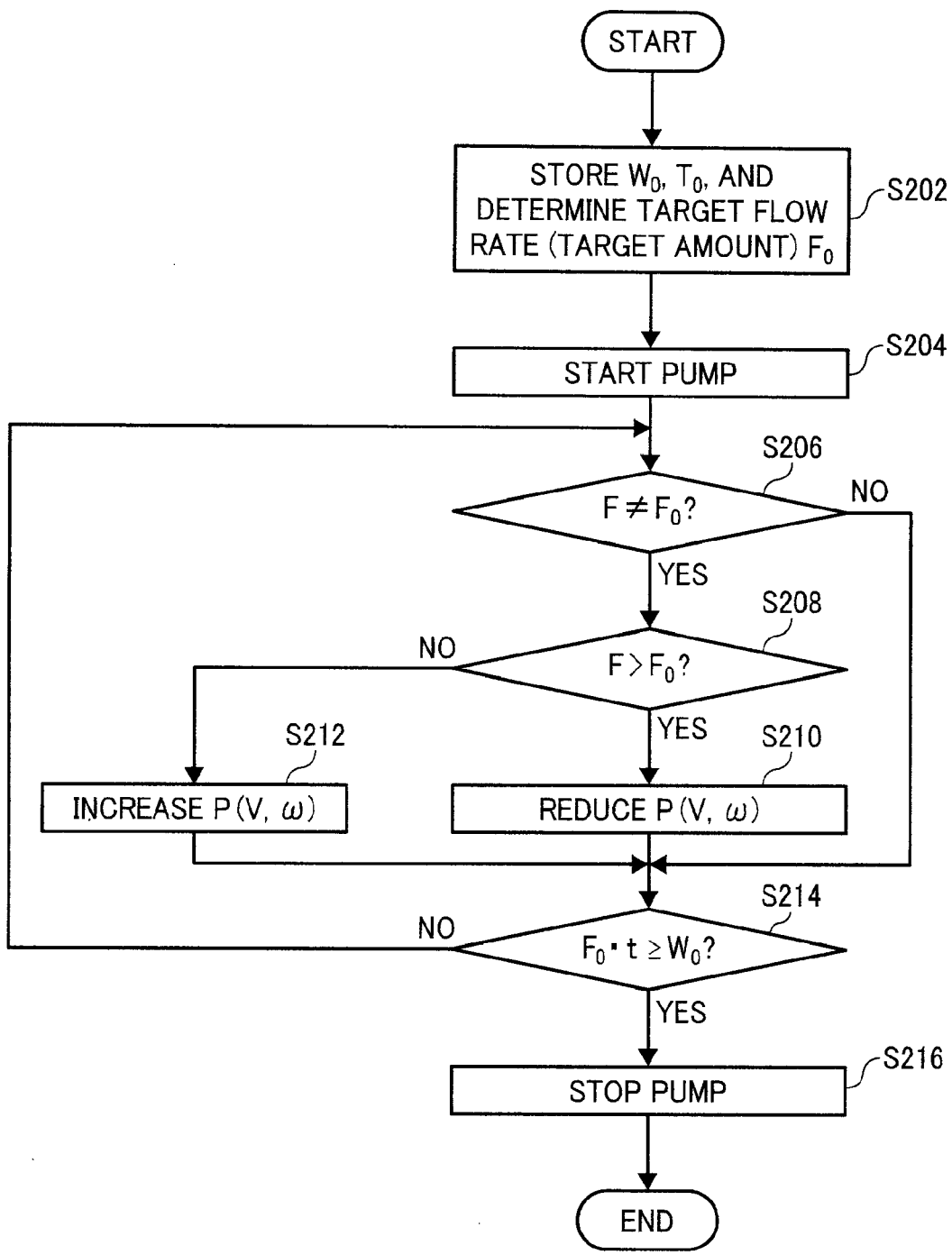

PIEZOELECTRIC ELEMENT DRIVING CIRCUIT

CROSS-REFERENCE TO RELATED APPLICATIONS

The present application claims priority to and incorporates by reference the entire contents of Japanese Patent Application No. 2010-052378 filed in Japan on Mar. 9, 2010.

BACKGROUND OF THE INVENTION

1. Field of the Invention

The present invention relates to a piezoelectric element driving circuit that drives a piezoelectric element.

2. Description of the Related Art

To persistently or moderately give a medicine to a living body, in general, intravenous drip injection (hereinafter, simply referred to as "drip") is used. Medical equipment for carrying out the intravenous drip injection is referred to as "drip device". In the drip device, one end of a tube is connected to a container that contains a liquid medicine, and the liquid medicine is injected into the living body through an injection needle attached to the other end of the tube. The tube is provided with a device for adjusting the injection amount of liquid medicine, which adjusts the injection rate (the injection amount per unit time) of the liquid medicine. As a device for adjusting the injection amount of liquid medicine, a device having a drip tube and a clamp has been used. With the conventional device, medical personnel, such as nurses, operate the clamp while viewing the dripping state of the liquid medicine in the drip tube.

Besides, a device, called liquid medicine injection pump, may be used to carry out the transfer and injection rate adjustment of the liquid medicine. In the liquid medicine injection pump, for example, an injection syringe is driven by a motor having a mechanism to control the number of rotations such that a liquid medicine is injected into a living body at a predetermined injection rate. When the liquid medicine injection pump is used, it is possible to automatically carry out the transfer and injection rate adjustment of the liquid medicine.

A portable drip device that is small and light-weight and driven with a battery has been developed. The liquid medicine injection pump using the motor as described above consumes high power, and is not suitably driven by a battery as a portable device and difficult to be downsized. Thus, a technologies has been developed in which a micropump that transfers a liquid medicine by an actuator using a piezoelectric element is applied to the liquid medicine injection pump for use in the drip device.

A micropump that uses an actuator constituted by a piezoelectric element has, for example, a structure in which the actuator is provided in one surface of a pressure chamber, through which a liquid medicine passes. In this micropump, a signal, such as square waves or sine waves, with a voltage varying in a predetermined cycle is applied to the piezoelectric element to vibrate the actuator. The vibration changes the volume of the pressure chamber through which the liquid medicine passes, and thereby the liquid medicine is transferred. The injection rate of the liquid medicine can be adjusted by controlling the frequency or amplitude of the signal applied to the actuator.

Japanese Patent Application Laid-open No. H8-109945 discloses a conventional technology in which an actuator is driven by using a sinusoidal signal. Japanese Patent Application Laid-open No. 2002-218772 discloses a conventional technology in which an actuator is driven by using a square-wave signal.

In an actuator for a micropump, piezoelectric elements, called unimorph or bimorph, are used. The driving voltage of such an actuator is relatively high, for example, around 100 V and it is difficult to control the frequency or amplitude by a small electronic circuit.

If square waves are used as the driving signal of an actuator constituted by a piezoelectric element, it is relatively easy to obtain a high-voltage driving signal by a chopper circuit or the like. However, a square-wave driving signal causes unnecessary vibration in an actuator, and noise at the time of driving increases.

An actuator constituted by a piezoelectric element is formed by bonding another piezoelectric element or a metal plate to a plate-shaped piezoelectric element. Thus, as the characteristic of the bonded structure, mechanical strength differs depending on whether the potential of the driving signal is positive or negative. For this reason, an actuator constituted by a piezoelectric element is not suitable for driving that applies sine waves having positive/negative symmetrical amplitude with no DC component for a long time.

SUMMARY OF THE INVENTION

It is an object of the present invention to at least partially solve the problems in the conventional technology.

According to an aspect of the present invention, a piezoelectric element driving circuit includes a signal generation unit, a transformer, a piezoelectric element, a first capacitor, a second capacitor, a first diode, a second diode, and a third diode. The signal generation unit generates a sinusoidal signal. The transformer receives the sinusoidal signal generated by the signal generation unit on the primary side, and includes a first terminal and a second terminal on the secondary side and a third terminal led from a midpoint between the first terminal and the second terminal. The piezoelectric element includes a first electrode connected to the first terminal. The first capacitor includes a first electrode connected to a second electrode of the piezoelectric element and a second electrode connected to the second terminal. The second capacitor includes a first electrode connected to a connection point of the second electrode of the piezoelectric element and the first electrode of the first capacitor. The first diode includes a cathode connected to a second electrode of the second capacitor and an anode connected to the third terminal. The second diode includes a cathode connected to a connection point of the second electrode of the second capacitor and the cathode of the first diode, and an anode connected to a connection point of the first electrode of the piezoelectric element and the first terminal. The third diode includes a cathode connected to the connection point of the first electrode of the piezoelectric element, the first terminal, and the anode of the second diode, and an anode connected to the connection point of the second electrode of the piezoelectric element, the first electrode of the first capacitor, and the first electrode of the second capacitor.

According to another aspect of the present invention, a pump includes a signal generation unit, a transformer, a piezoelectric element, a first capacitor, a second capacitor, a first diode, a second diode, a third diode, and a space. The signal generation unit generates a sinusoidal signal. The transformer receives the sinusoidal signal generated by the signal generation unit on the primary side, and includes a first terminal and a second terminal on the secondary side and a third terminal led from a midpoint between the first terminal and the second terminal. The piezoelectric element includes a first electrode connected to the first terminal. The first capacitor includes a first electrode connected to a second electrode of the piezoelectric element and a second electrode connected to the second terminal. The second capacitor includes a first electrode connected to a connection point of the second electrode of the piezoelectric element and the first electrode of the first capacitor. The first diode includes a cathode connected to a second electrode of the second capacitor and an anode connected to the third terminal. The second diode includes a cathode connected to a connection point of the second electrode of the second capacitor and the cathode of the first diode, and an anode connected to a connection point of the first electrode of the piezoelectric element and the first terminal. The third diode includes a cathode connected to the connection point of the first electrode of the piezoelectric element, the first terminal, and the anode of the second diode, and an anode connected to the connection point of the second electrode of the piezoelectric element, the first electrode of the first capacitor, and the first electrode of the second capacitor. The space has a volume which changes by driving of the piezoelectric element, and includes an inlet and an outlet of a fluid.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a flowchart of an example of flow rate control of a liquid medicine in a liquid medicine injection amount adjustment device;

DETAILED DESCRIPTION OF THE PREFERRED EMBODIMENTS

General Architecture of Exemplary Embodiments

Figure 1:
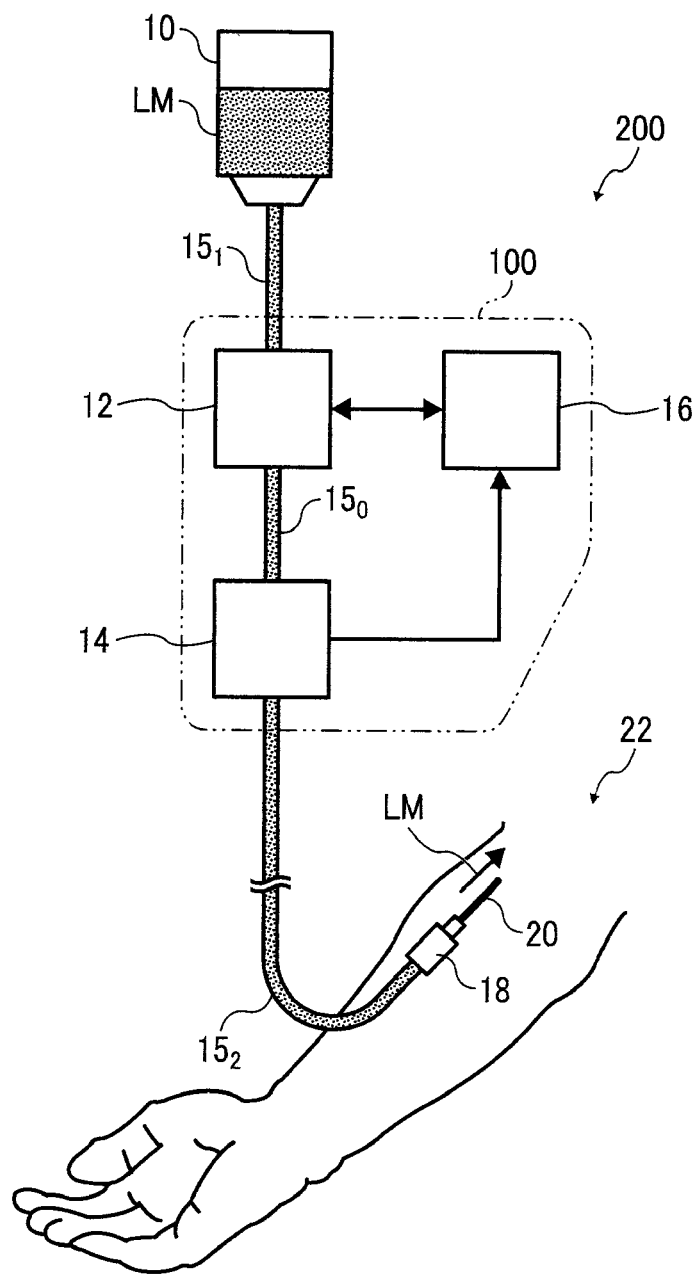
FIG. 1 is a schematic view of the configuration of a liquid medicine injection system that can be applied to each embodiment of the invention.

Exemplary embodiments of the invention will be described in detail with reference to the accompanying drawings. First, a description will be give of the general architecture of the embodiments. FIG. 1 schematically illustrates the configuration of a liquid medicine injection system 200 that can be applied to the embodiments of the invention. The liquid medicine injection system 200 includes a reservoir 10 that contains a liquid medicine LM to be injected into a living body, a liquid medicine injection line one end of which is connected to the reservoir 10 and which is provided with an injection needle 20, one end of which is thrust into a vein of a living body 22, through an attachment 18 at the other end thereof, and reaches the living body 22 from the reservoir 10, and a liquid medicine injection amount adjustment device 100 which is connected to the halfway of the liquid medicine injection line.

In injecting the liquid medicine LM into a portion of the living body 22, for example, a vein, the reservoir 10 is connected to one end of the liquid medicine injection amount adjustment device 100, i.e., one end (supply end) of a micropump 12 through a tube $15_1$. As the tube $15_1$, a flexible tube having high elasticity and self-expandability is used.

One end of a tube $15_2$ is connected to the other end of the liquid medicine injection amount adjustment device 100, i.e., the discharge end of a flow rate sensor 14. The attachment 18 with the injection needle 20 fixed at the tip thereof is connected to the other end (tip) of the tube $15_2$. In injecting the liquid medicine LM into a vein, a nurse or the like thrusts the injection needle 20 into the living body 22 through the body surface and keeps the tip of the injection needle 20 in the vein. At this time, the nurse or the like fixes the base of the injection needle 20 or the attachment 18 to the body surface of the living body 22 by using an adhesive tape or the like such that the tip of the injection needle 20 does not come out of the vein. FIG. 1 illustrates the state after fixing.

Similarly to the tube $15_1$, a flexible tube is used as the tube $15_2$. The tube $15_2$ is flexed, thus even when the tip portion thereof is moved, a flow channel through which the liquid medicine LM flows is secured.

In the liquid medicine injection system 200, the flow channel through which the liquid medicine LM flows is constituted by the tube $15_1$, the liquid medicine injection amount adjustment device 100, the tube $15_2$, and the injection needle 20 in order from the reservoir 10 to the vein of the living body 22. In the middle of the flow channel, there is no member for closing the flow channel even though the respective sections constituting the liquid medicine injection amount adjustment device 100 are included. Thus, the flow channel constitutes a single open channel from the reservoir 10 to the vein of the living body 22.

In the middle of the flow channel from the reservoir 10 to the injection needle 20, a valve may be provided to prevent backflow of the liquid medicine LM. It is assumed that the value does not apply resistive force or applies negligible resistive force to the fluid when the liquid medicine LM flows forward (a direction from the reservoir 10 to the injection needle 20).

The configuration, functions, and the like of the liquid medicine injection amount adjustment device 100 will be described in detail. The liquid medicine injection amount adjustment device 100 has a micropump 12, a flow rate sensor 14, and a control unit 16. One end of the micropump 12, i.e., the supply end is connected to the reservoir 10 through the tube $15_I$. One end of the flow rate sensor 14, i.e., the supply end is connected to the other end of the micropump 12, i.e., the discharge end through a tube $15_O$. The control unit 16 is electrically connected to the micropump 12 and the flow rate sensor 14, and controls the micropump 12 in accordance with the output of the flow rate sensor 14.

For the tube $15_O$, for example, any tubular member may be used insofar as the tubular member connects the micropump 12 and the flow rate sensor 14 such that the liquid medicine LM can flow between the micropump 12 and the flow rate sensor 14, regardless of material and shape.

In the embodiments of the invention, as the micropump 12, a diaphragm pump is used which is manufactured by a micromachine technique (MEMS technique) and uses a piezoelectric element as a driving source. A diaphragm pump is a type of volume pump and transfers the liquid medicine LM by using changes in the volume of the diaphragm.

Figure 2A:
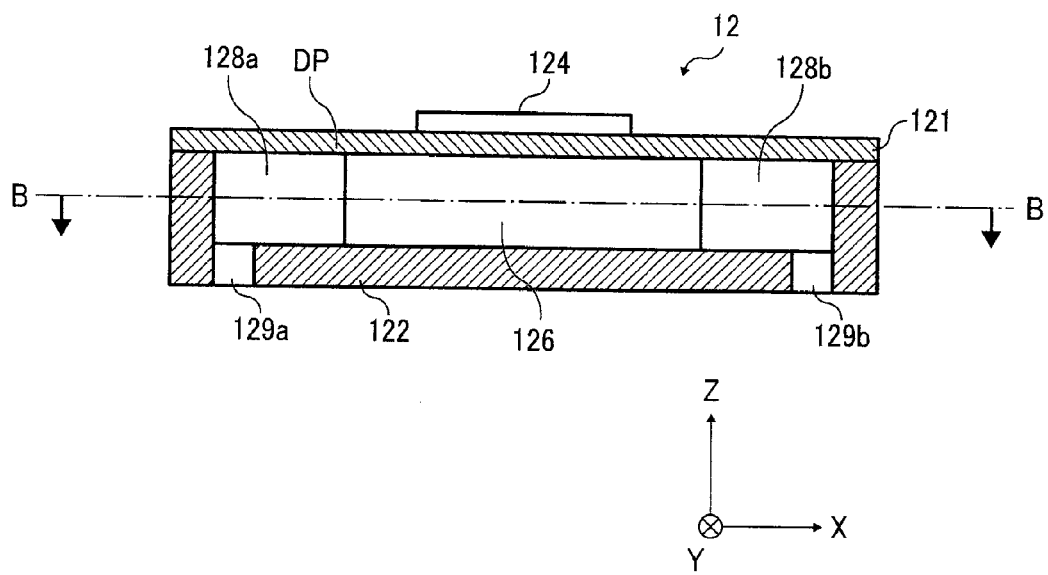
FIGS. 2A and 2B are schematic views of the structure of an example of a micropump.
Figure 2B:
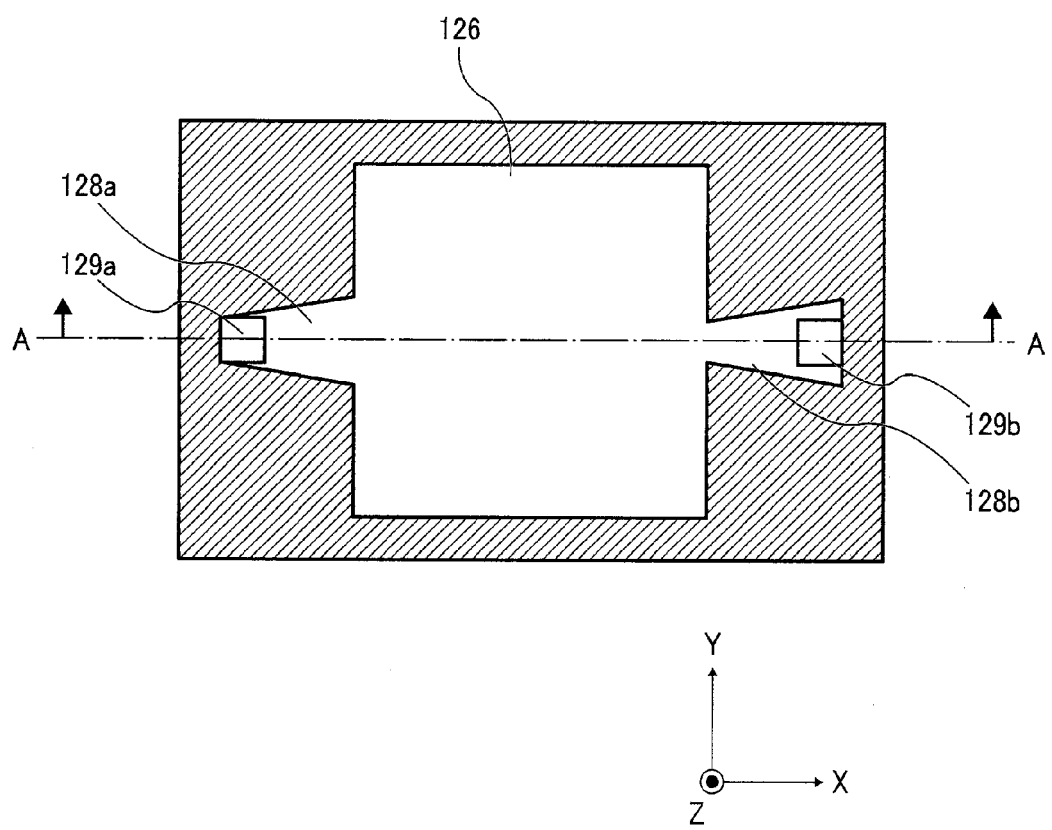

FIGS. 2A and 2B illustrate the structure of an example of the micropump 12. FIG. 2A is a longitudinal sectional view of the micropump 12. FIG. 2B is a sectional view taken along the line B-B of FIG. 2A. FIG. 2A corresponds to a cross-section taken along the line A-A of FIG. 2B.

As illustrated in FIG. 2A, the micropump 12 has a plate-shaped first substrate 121a portion of which serves as a diaphragm, a second substrate 122 which is bonded to one surface (−Z-side surface) of the first substrate 121, and a piezoelectric element 124 which is fixed to the central portion of the other surface (+Z-side surface) of the first substrate 121. As an example, the first substrate 121 is made of borosilicate glass and the second substrate 122 is made of silicon. A portion including a portion of the first substrate 121 in contact with the piezoelectric element 124 serves as a diaphragm. For convenience, this portion is called a diaphragm portion DP.

As illustrated in FIGS. 2A and 2B, the second substrate 122 has a concave portion having a given depth in the surface facing the first substrate 121. The concave portion has three portions of a pressure chamber 126 which is located in the central portion in the X-axis direction and has a rectangular shape in plan view, a groove 128a which communicates with the −X-side end portion of the pressure chamber 126, and a groove 128b which communicates with the +X-side end portion of the pressure chamber 126. Practically, the pressure chamber 126 is formed by bonding the first substrate 121 to the second substrate 122 to cover the concave portion formed in the second substrate 122. In the example of FIGS. 2A and 2B, for convenience, it is assumed that the pressure chamber 126 is formed in the second substrate 122.

A through hole 129 is formed at the bottom wall of the second substrate 122 corresponding to the −X-side end portion in the groove 128a to communicate the exterior of the second substrate 122 with the internal space of the groove 128a. A through hole 129b is formed at the bottom wall of the second substrate 122 corresponding to the +X-side end portion in the groove 128b to communicate the exterior of the second substrate 122 and the internal space of the groove 128b.

The through hole 129a functions as the inlet of the liquid medicine LM to the internal space of the micropump 12 including the pressure chamber 126, and the through hole 129b serves as the outlet of the liquid medicine LM from the internal space. Hereinafter, the through holes 129a and 129b are respectively referred to as an inlet 129a and an outlet 129b. The inlet 129a and the outlet 129b are respectively connected to tubular members (not illustrated) which respectively constitute the supply port and discharge port of the micropump 12.

As illustrate in FIG. 2B, the grooves 128a and 128b are all formed with an gradually increasing cross-sectional area from the −X end toward the +X end, i.e., from the inlet side toward the outlet side, and function as a diffuser. Hereinafter, the grooves 128a and 128b are respectively referred to as diffusers 128a and 128b. The diffuser is provided to convert kinetic energy of the fluid to pressure energy.

As described above, in the micropump 12 which can be applied to the embodiments of the invention, a single flow channel is formed by the diffuser 128a, the pressure chamber 126, and the diffuser 128b in order from the inlet 129a provided in the second substrate 122 to the outlet 129b. In the middle of this flow channel, there is no member for closing the flow channel, thus a single open channel is constituted from the inlet 129a to the outlet 129b. That is, the micropump 12 is a valveless micropump.

Figure 3A:
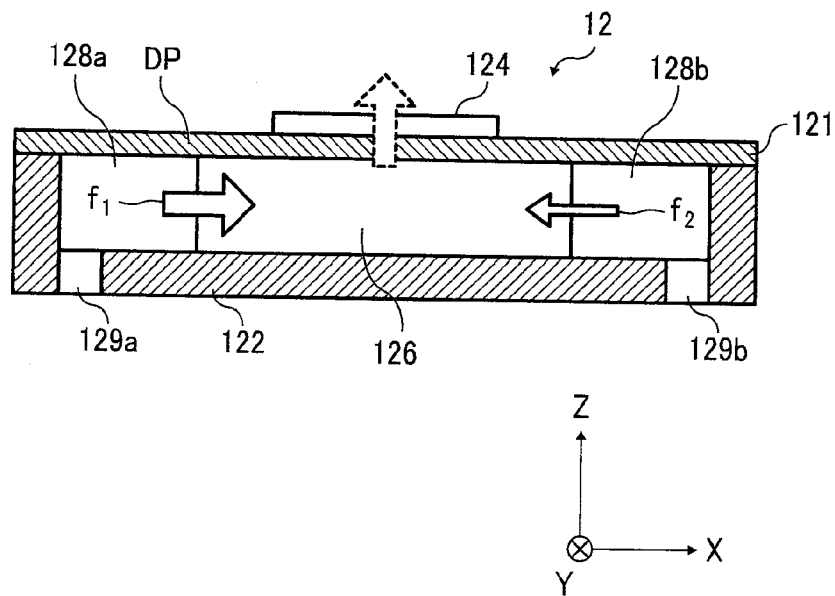
FIGS. 3A and 3B are schematic views illustrating an operation of a micropump.
Figure 3B:
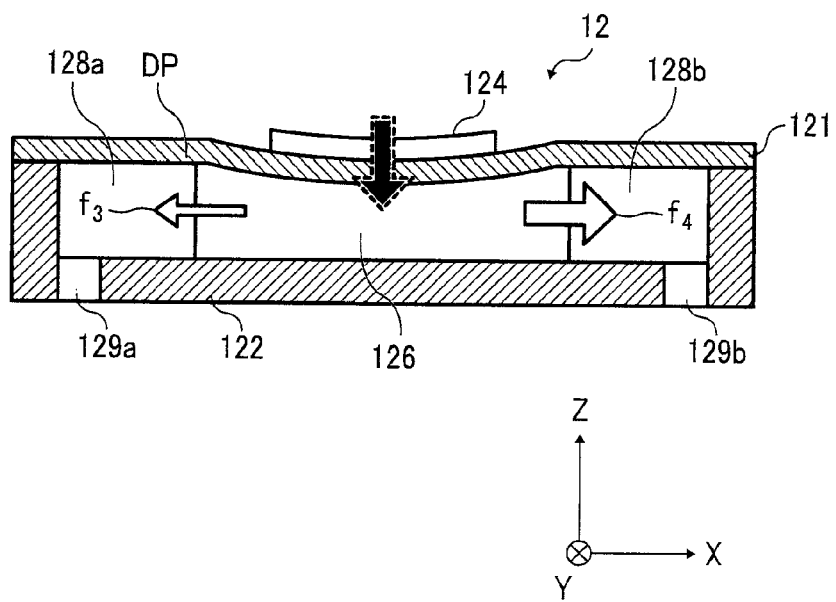

The operation of the micropump 12 will be schematically described with reference to FIGS. 3A and 3B. In a state where no voltage is applied to the piezoelectric element 124, as illustrated in FIG. 3A, the diaphragm portion DP of the first substrate 121 to which the piezoelectric element 124 is bonded has an unflexed planar shape. In this state, the pressure chamber 126 is a non-contraction state. Meanwhile, if a voltage is applied to the piezoelectric element 124, as illustrated in FIG. 3B, the diaphragm portion DP of the first substrate 121 is flexed in the −Z direction as indicated by an arrow. When this happens, the pressure chamber 126 contracts and is in a contraction state.

Thus, voltage pulses are applied to the piezoelectric element 124 to drive the piezoelectric element 124 and the diaphragm portion DP vibrates such that the pressure chamber 126 can be repeatedly in the contraction state and the non-contraction state. At this time, the contraction ratio of the pressure chamber 126 (the flexure amount of the diaphragm portion DP) is determined by the voltage value of the voltage pulses, and the number of repetitions of the contraction and expansion of the pressure chamber 126 is determined by the frequency of the voltage pulses.

As illustrated in FIG. 3A, if the pressure chamber 126 is transited from the contraction state to the non-contraction state, the fluids (liquid medicine LM) flow from both the inlet 129a and the outlet 129b into the pressure chamber 126. The fluids which flow from the inlet 129a and the outlet 129b are respectively denoted by arrows $f_1$ and $f_2$. The direction of each of the arrows $f_1$ and $f_2$ represents the transfer direction of the fluid, and the size thereof represents the amount of fluid.

The fluids $f_1$ and $f_2$ respectively pass through the diffusers 128a and 128b. As described above, the diffusers 128a and 128b are all formed with a gradually increasing cross-sectional area in the +X direction. For this reason, the diffusers 128a and 128b apply weak resistance to the fluid flowing in the +X direction and also apply strong resistance to the fluid flowing in the −X direction. Thus, in the state of FIG. 3A, the fluid $f_1$ meets with weak resistance from the diffuser 128a and the fluid $f_2$ meets with strong resistance from the diffuser 128b such that the flow rate of the fluid $f_1$ becomes greater than the flow rate of the fluid $f_2$.

Meanwhile, as illustrated in FIG. 3B, if the pressure chamber 126 is transited from the non-contraction state to the contraction state, the fluid flows from the pressure chamber 126 to both the inlet 129a and the outlet 129b. The fluids which flow to the inlet 129a and the outlet 129b are respectively denoted by arrows $f_3$ and $f_4$. The direction of each of the arrows $f_3$ and $f_4$ represents the transfer direction of the fluid, and the size thereof represents the flow rate. The fluid $f_3$ meets with strong resistance from the diffuser 128a and the fluid $f_4$ meets with weak resistance from the diffuser 128b such that the flow rate of the fluid $f_4$ becomes greater than the flow rate of the fluid $f_3$.

If the pressure chamber 126 is transited from the contraction state to the non-contraction state once, the fluid with the amount of net $|f_1-f_3|$ flows from the inlet 129a to the pressure chamber 126, and the fluid with the amount of $|f_4-f_2|$ also flows from the pressure chamber 126 to the outlet 129b. Thus, the fluid with the amount of net $f=|f_1-f_3|=|f_4-f_2|$ flows from the inlet 129a to the outlet 129b.

Here, it is assumed that the fluid has incompressibility. If the volume of the pressure chamber 126 is W and the contraction ratio which is the ratio of the volume of the contraction state to the volume of the non-contraction state is $\beta$, the relationship $f=W(1-\beta)$ is established.

The pressure chamber 126 repeats the contraction state and the non-contraction state such that the normal flow of the fluid is generated from the inlet 129a to the outlet 129b. If the number of repetitions per unit time between the contraction state and the non-contraction state of the pressure chamber 126 $\omega$, the fluid with the volume flow rate $F=\omega f=\omega W(1-\beta)$ per unit time flows from the inlet 129a to the outlet 129b.

The volume flow rate F can be controlled by adjusting at least one of the voltage value V of the voltage pulses applied to the piezoelectric element 124 and the frequency of the pulses. If the voltage value V of the voltage pulses applied to the piezoelectric element 124 increases, the amount of expansion and contraction of the piezoelectric element 124, i.e., the flexure of the diaphragm portion DP increases. Similarly, if the voltage value V of the voltage pulses applied to the piezoelectric element 124 decreases, the amount of expansion and contraction of the piezoelectric element 124, i.e., the flexure of the diaphragm portion DP decreases. Thus, the contraction ratio $\beta$ of the pressure chamber 126 can be adjusted by changing the voltage value of the voltage pulses applied to the piezoelectric element. Therefore, the flow rate $F=\omega W(1-\beta)$ can be controlled.

If the frequency of the pulses increases, the number of vibration of the diaphragm portion DP, i.e., the number $\omega$ of repetitions per unit time between the contraction state and the non-contraction state of the pressure chamber 126 increases. Similarly, if the frequency of the pulses decreases, the number of vibration of the diaphragm portion DP, i.e., the number $\omega$ of repetitions per unit time between the contraction state and the non-contraction state of the pressure chamber 126 decreases. Thus, the number $\omega$ of repetitions per unit time between the contraction state and the non-contraction state of the pressure chamber 126 can be adjusted by changing the frequency of the voltage pulses applied to the piezoelectric element 124. Therefore, the flow rate $F=\omega W(1-\beta)$ can be controlled.

In principle, the frequency of the voltage pulses is equal to the number $\omega$ of repetitions per unit time between the contraction state and the non-contraction state of the pressure chamber 126, thus the frequency of the voltage pulses is denoted by the character $\omega$.

As the flow rate sensor 14, for example, a thermal mass sensor is used. In a thermal mass sensor, a fluid (liquid medicine LM) flows in an internal conduit line and the amount of heat transmitted from the fluid to the sensor or from the sensor to the fluid through a conduit wall, thereby measuring the flow rate of the fluid flowing in the conduit line. When the thermal mass sensor is used as the flow rate sensor 14, a probe is not inserted into the fluid, making it possible to measure the flow rate without obstructing the flow of the fluid.

The control unit 16 is constituted by, for example, a microprocessor as the brain thereof, and performs overall control of the liquid medicine injection amount adjustment device 100.

The control unit 16 is electrically connected to the micropump 12 and the flow rate sensor 14. The measurement information of the flow rate of the liquid medicine LM is supplied from the flow rate sensor 14 to the control unit 16. The control unit 16 adjusts at least one of the voltage value V and the frequency $\omega$ of the voltage pulses applied to the micropump 12 (exactly, the piezoelectric element 124) on the basis of the measurement information of the flow rate such that the flow rate of the liquid medicine LM coincides with a defined target amount. The details of control of the micropump 12 will be described below in detail.

The control unit 16 may be connected to at least one of the micropump 12 and the flow rate sensor 14 through a wireless communication line.

The control unit 16 also monitors power of the micropump 12. Although power of the micropump is pressure (exactly, pressure energy) applied to the fluid to allow the fluid (liquid medicine LM) to flow forward, it is not necessary to take into consideration specific pressure practically applied to the fluid (liquid medicine LM) by the micropump 12 as power, and it should suffice that the amount related to the pressure is taken into consideration. From the configuration of the micropump 12, power P becomes the function $P(V,\omega)$ of the voltage value V and the frequency $\omega$ of the voltage pulses to be applied.

For example, the product of the voltage value V and the frequency $\omega$ of the voltage pulses to be applied can be defined as the power P. Specifically, the power P can be defined as $P(V,\omega) \equiv V\omega$. The invention is not limited thereto. When the voltage value of the voltage pulses to be applied constantly has a given value $V_0$ and only the frequency $\omega$ is variable, the power P may be simply defined as $P(V_0,\omega) \equiv \omega$. When the frequency is constantly a given frequency $\omega_0$ and only the voltage value V is variable, the power P may be simply defined as $P(V,\omega_0) \equiv V$.

The control unit 16 includes a storage device (not illustrated) and stores the monitoring result of the power P in the storage device for each predetermined time ($\Delta t$). The stored monitoring result is erased when a given time has been elapsed after being stored. Thus, the monitoring results (a given number of latest monitoring results) in a given time from the present are constantly stored in the storage device.

The control unit 16 diagnoses the medication situation of the liquid medicine LM by a method described below on the basis of the monitoring information of the power P of the micropump 12. When abnormality in the medication situation is detected, the control unit 16 stops to inject the liquid medicine LM or carries out emergency treatment, such as giving an alarm. Normally, when the injection of the liquid medicine LM with a defined amount (target injection amount) is completed, ending treatment is carried out to stop the injection of the liquid medicine LM.

In addition, the control unit 16 includes an operation panel (not illustrated) on which an operator inputs the (target) injection amount, (target) injection time, and the like of a liquid medicine, a display panel (not illustrated) which displays the injection situation of the liquid medicine LM, and an interface (not illustrated), such as an alarm device, which transmits abnormality in the injection situation.

Next, an example of flow rate control of the liquid medicine LM in the liquid medicine injection amount adjustment device 100 will be described with reference to a flowchart of FIG. 4. Each step in the flowchart of FIG. 4 is performed under the control of the microprocessor in the control unit 16.

Prior to starting the injection of the liquid medicine LM, the operator inputs on the operation panel the total amount (target injection amount) $W_0$ of the liquid medicine LM to be injected into the living body 22 and the target injection time $T_0$ until the injection of the liquid medicine LM with that amount is completed. Thereafter, if the operator operates the operation panel to input an instruction to start injection, the process illustrated in FIG. 4 starts.

In Step S202, first, the control unit 16 stores the input target injection amount $W_0$ and target injection time $T_0$ in the storage device, and determines the target flow rate (target amount) $F_0$ of the liquid medicine LM per unit time on the basis of the target injection amount $W_0$ and the target injection time $T_0$. Next, in Step S204, the control unit 16 activates the micropump 12.

Next, in Steps S206 to S212, the control unit 16 adjusts the power $P(V,\omega)$ of the micropump 12 on the basis of the comparison result of the flow rate F of the liquid medicine LM supplied from the flow rate sensor 14 and the target amount $F_0$ determined in advance such that the flow rate F coincides with the target amount $F_0$. That is, in Step S206, the control unit 16 compares the flow rate F with the target amount $F_0$ to determine whether the flow rate F and the target amount $F_0$ are different from each other. If it is determined that the flow rate F and the target amount $F_0$ are not different from each other, i.e., the flow rate F and the target amount $F_0$ coincide with each other, the process moves to Step S214.

In Step S206, If it is determined that the flow rate F and the target amount $F_0$ are different from each other, the process moves to Step S208 and it is determined whether the flow rate F exceeds the target amount $F_0$. If it is determined that the flow rate F exceeds the target amount $F_0$, the process moves to Step S210 and the control unit 16 reduces the power $P(V,\omega)$. On the other hand, if it is determined that the flow rate F is equal to or smaller than the target amount $F_0$, the process moves to Step S212 and the control unit 16 increases the power $P(V,\omega)$. After Step S210 or Step S212, the process moves to Step S214.

To adjust the flow rate F of the fluid, the control unit 16 may adjust the voltage value V while maintaining the frequency $\omega$ of the voltage pulses to be applied to the piezoelectric element 124 constant, may adjust the frequency $\omega$ while maintaining the voltage value V constant, or may adjust both the voltage value V and the frequency $\omega$.

In Step S214, the control unit 16 compares the injection amount $F_0 \cdot t$ (t: elapsed time) of the liquid medicine LM with the target injection amount $W_0$, and determines whether the injection amount $F_0 \cdot t$ is equal to or greater than the target injection amount $W_0$. If the injection amount $F_0 \cdot t$ is smaller than the target injection amount $W_0$, i.e., when the injection amount $F_0 \cdot t$ does not reach the target injection amount $W_0$, the process returns to Step S206, and Steps S206 to S212 are performed again.

On the other hand, if it is determined in Step S214 that the injection amount $F_0 \cdot t$ is equal to or greater than the target injection amount $W_0$, the process moves to Step S216. In this case, it can be determined that the injection of the liquid medicine LM is normally injected. In Step S216, the control unit 16 stops the micropump 12. At the same time, ending process, such as giving an alarm, is carried out. A sequence of steps in the flowchart of FIG. 4 ends.

First Embodiment

Next, a first embodiment of the invention will be described. In the first embodiment, the piezoelectric element 124 which puts the pressure chamber 126 of the micropump 12 in the contraction state and the non-contraction state is driven with a driving signal by sine waves. As described above, as the characteristic of the bonded structure, the piezoelectric element 124 has different mechanical strength depending on the positive and negative of the potential of the driving signal. Thus, in the first embodiment, a DC bias is provided with respect to the driving signal by sine waves for driving the piezoelectric element 124.

In the first embodiment, a configuration is made such that the piezoelectric elements 124 are respectively arranged on both surfaces of the pressure chamber 126. The piezoelectric element 124 arranged on both surfaces of the pressure chamber 126 are driven with sine waves in reverse phases.

Figure 5A:
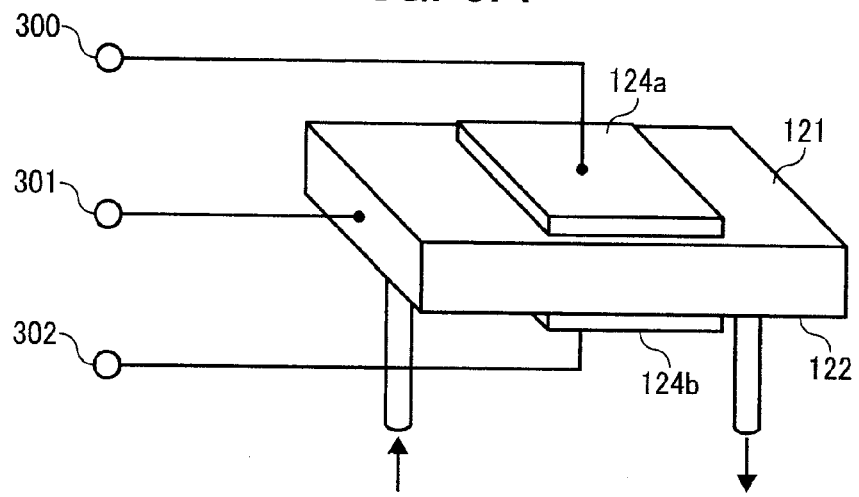
FIGS. 5A to 5C are schematic views of an example of the configuration of a micropump used in a first embodiment of the invention.
Figure 5B:
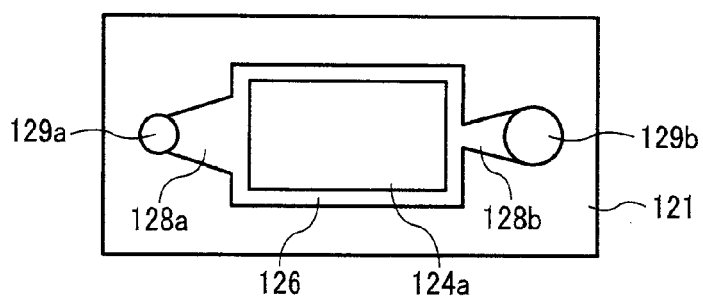
Figure 5C:
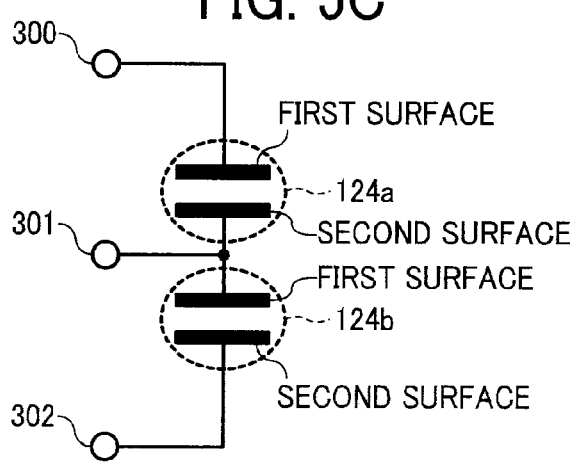

FIGS. 5A to 5C illustrate the configuration of an example of the micropump 12 which is used in the first embodiment. In FIGS. 5A to 5C, the portions common to FIGS. 2A and 2B described above are represented by the same reference numerals, and detailed description thereof will be omitted. FIG. 5A is an appearance diagram of the micropump 12. FIG. 5B is a sectional view which corresponds to FIG. 2B described above. FIG. 5C illustrates electrical connection of piezoelectric elements 124a and 124b which are provided on both surfaces of the pressure chamber 126.

The piezoelectric element is regarded as a capacitor in an equivalent circuit. Thus, in the following description, the piezoelectric element in each circuit diagram is expressed as a capacitor.

As illustrated in FIG. 5A, the first piezoelectric element 124a is fixed in the central portion of the first substrate 121, and the second piezoelectric element 124b is fixed at a position of the second substrate 122 facing the piezoelectric element 124a. At this time, the first piezoelectric element 124a and the second piezoelectric element 124b are respectively fixed to the first substrate 121 and the second substrate 122 such that the directions defined from the bonded structure are arranged in the same direction. Specifically, the first piezoelectric element 124a is configured such that the first surface is fixed to the first substrate 121 in the direction defined from the bonded structure. Meanwhile, the second piezoelectric element 124b is configured such that the second surface is fixed to the second substrate 122 in the direction defined from the bonded structure. In this case, it is preferable that the first substrate 121 and the second substrate 122 are made of the same material.

As illustrated in FIG. 5C, the electrode of the first surface of the first piezoelectric element 124 is connected to a terminal 300. The electrode of the second surface of the first piezoelectric element 124a facing the first surface and the electrode of the first surface of the second piezoelectric element 124b are commonly connected to a terminal 301. The electrode of the second surface of the second piezoelectric element 124b is connected to a terminal 302.

In the configuration of FIG. 5C, sine waves in reverse phases are applied between the terminal 300 and the terminal 301 and between the terminal 301 and the terminal 302. As described above, the first piezoelectric element 124a and the second piezoelectric element 124b are respectively fixed to the first substrate 121 and the second substrate 122 in a state where the directions are arranged. For this reason, for example, the second piezoelectric element 124b is also flexed inward of the pressure chamber 126 at the timing at which the first piezoelectric element 124a is flexed inward of the pressure chamber 126. Therefore, it is possible to increase the contraction ratio of the pressure chamber 126 in the contraction state compared to a case where the piezoelectric element is provided on one surface of the pressure chamber 126.

Figure 6:
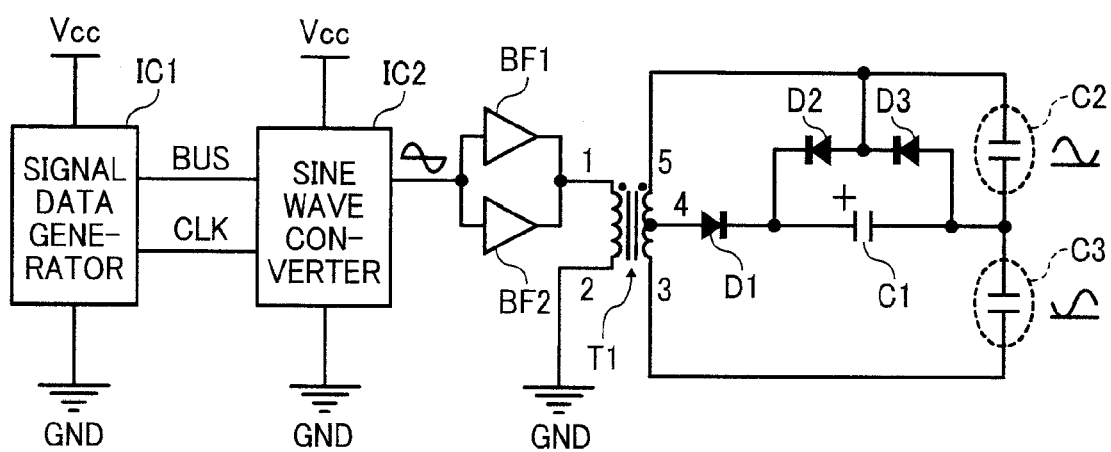
FIG. 6 is a circuit diagram of an example of a piezoelectric element driving circuit according to the first embodiment.

FIG. 6 illustrates an example of the piezoelectric element driving circuit of the first embodiment. In FIG. 6, only the portions necessary for describing the first embodiment are illustrated, and the portions, for example, the peripheral circuits of an integrated circuit, such as an OP amplifier, which have little direct relation to the first embodiment are omitted. In FIG. 6, Vcc denotes power which is supplied from a power supply section (not illustrated) and GND denotes the common ground potential.

A signal data generator IC1 is, for example, a programmable logic circuit (FPGA: Field Programmable Gate Array) and generates signal data (hereinafter, referred to as sinusoidal data) for constituting sine waves. For example, the signal data generator IC1 generates sinusoidal data constituting sine waves with designated amplitude and frequency under the control of the control unit 16. It is also possible to control the phase of the sinusoidal signal generated from sinusoidal data by adjusting the output timing of sinusoidal data. Generated sinusoidal data is supplied to a sine wave converter 102 through a bus BUS. The signal data generator IC1 outputs a clock CLK which is synchronized with generated sinusoidal data and supplies the clock CLK to the sine wave converter IC2.

The sine wave converter 102 has a D/A converter, and carries out D/A conversion for sinusoidal data supplied from the signal data generator IC1 to generate a sinusoidal signal by an analog signal. The sinusoidal signal output from the sine wave converter IC2 is supplied to a primary-side terminal 1 of a transformer T1 through buffer circuits BF1 and BF2, and passes through between the terminal 1 and a grounded terminal 2 of the transformer T1 to drive the transformer T1. The transformer T1 is configured such that the primary-side terminal 1 and a secondary-side terminal 5 have the same polarity.

The buffer circuits BF1 and BF2 are amplifiers which current-amplifies the sinusoidal signal output from the sine wave converter IC2 to power for driving the transformer T1. In the example of FIG. 6, a plurality of buffer circuits BF1 and BF2 having the same amplification factor are connected to each other in parallel to constitute a single buffer circuit.

A plurality of buffer circuits need not necessarily be used, and only a single buffer circuit may be used. The output of the sine wave converter 102 may be floated from the ground potential, and signal lines may be respectively connected to the two buffer circuits BF1 and BF2. The output may be amplified by the buffer circuits BF1 and BF2 with the same amplification factor in reverse phases and then respectively supplied to the primary-side terminal 1 and the terminal 2 of the transformer T1. In this case, it is possible to obtain a sinusoidal signal having substantially twice the voltage. To drive the transformer T1, in a bipolar transistor or the like, the primary side of the transformer T1 may be connected as a ground-side load of an emitter follower to constitute a buffer circuit. To carry out voltage amplification, a grounded emitter circuit, a push-pull circuit, or the like may be used as a buffer circuit.

On the secondary side of the transformer T1, a terminal 3 (second terminal) and a terminal 5 (first terminal) are provided, for example, at both ends of a secondary-side winding and a center tap 4 (third terminal) is provided which is led from the midpoint between the terminal 3 and the terminal 5. The center tap 4 is grounded through high resistance (not illustrated) and connected to the anode of a diode D1 (first diode). The cathode of the diode D1 is connected to the cathode of a diode D2 (second diode) and also to one electrode of a capacitor C1 (second capacitor). The other electrode of the capacitor C1 is connected to the anode of a diode D3 (third diode) and also to a common connection point of the second electrode of a piezoelectric element C2 and the first electrode of a piezoelectric element C3 (first capacitor). The second electrode of the piezoelectric element C3 is connected to the terminal 3 of the transformer T1. The first electrode of the piezoelectric element C2 is connected to the cathode of the diode D3, the anode of the diode D2, and the terminal 5 of the transformer T1.

It is assumed that the first electrode of the piezoelectric element C2 or C3 corresponds to one of the first and second surfaces defined by the above-described bonded structure, for example, the first surface, and the second electrode corresponds to the second surface.

In the configuration of FIG. 6, the center tap 4 of the transformer T1 is connected to a common connection point of the piezoelectric elements C2 and C3 through the diode D1 and the capacitor C1. Thus, the driving signals by sine waves in reverse phases are respectively applied to the piezoelectric elements C2 and C3.

To vibrate the piezoelectric elements C2 and C3 to the same extent, substantially the same voltage needs to be applied to the piezoelectric elements C2 and C3. For this reason, as the piezoelectric elements C2 and C3, piezoelectric elements having substantially the same electrostatic capacitance are selected.

According to the circuit configuration of FIG. 6, the capacitor C1 continues to hold a voltage which is half of the voltage between both extreme values in the sine wave output from each of the terminal 3 and the terminal 5 of the transformer T1. The voltage which is held in the capacitor C1 is applied as a positive potential-side DC bias with respect to a voltage at the common connection point of the piezoelectric elements C2 and C3. Thus, the potential of the secondary side of the transformer T1 is shifted to a positive potential with respect to the potential of the center tap 4, the driving signals by sine waves in reverse phases based on the common connection point are applied to the piezoelectric elements C2 and C3 as the signal of a voltage with a DC bias applied to the positive potential side by half of the amplitude of the sine waves.

In FIG. 6, the diodes D2 and D3 are used for rectification. The diode D1 serves to prevent leakage the electric changes accumulated in the capacitor C1 to the transformer T1. The electric charges accumulated in the capacitor C1 leaks to the center tap 4 depending on the phase of the output signal of the transformer T1. If leakage occurs, the voltages to be applied to the piezoelectric elements C2 and C3 become imbalanced. The diode D1 is inserted between the center tap 4 and the capacitor C1, inhibiting leakage and preventing the voltages to be applied to the piezoelectric elements C2 and C3 from becoming imbalanced.

Instead of the diode D1, even when high resistance of about 1 MΩ (megaohm) to 10 MΩ is inserted, it is possible to inhibit leakage from the capacitor C1 to the center tap 4. However, in the case of the high resistance, a force against leakage is small compared to the diode D1. Thus, a DC bias voltage which is applied to each of the piezoelectric elements C2 and C3 becomes unstable.

In FIG. 6, as the transformer T1, for example, a transformer is used which has a turn ratio such that the output of about ±80 V to ±200 V on the secondary side is obtained with respect to the input of about ±3 V on the primary side. The piezoelectric elements C2 and C3 have electrostatic capacitance of about 4 nF (nanofarad). The capacitor C1 has electrostatic capacitance of, for example, 5 nF to 10 nF greater than the electrostatic capacitance of the piezoelectric elements C2 and C3.

Figure 7A:
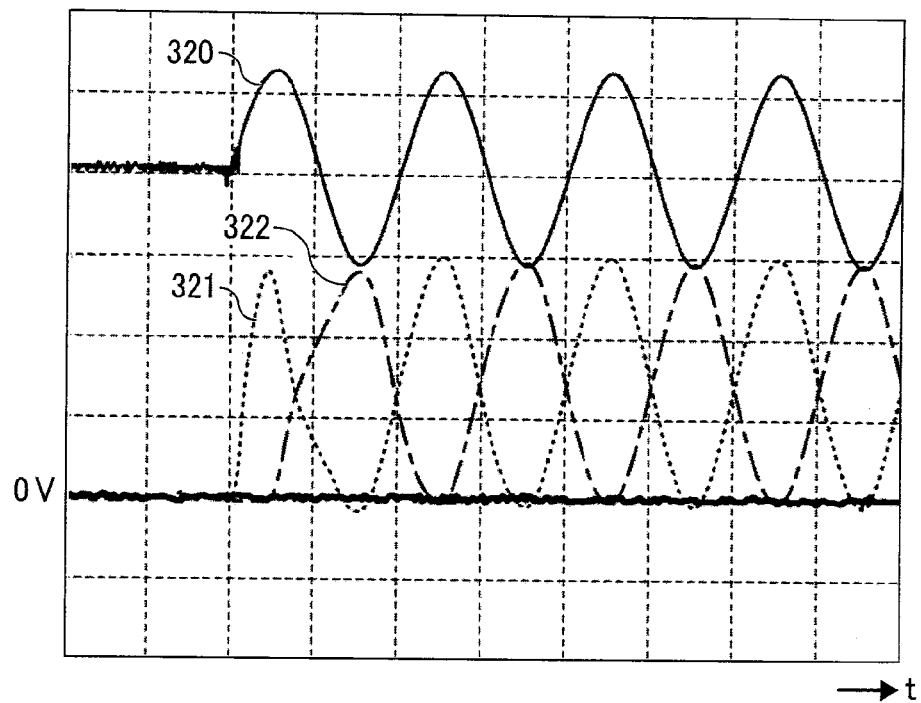
FIGS. 7A and 7B are schematic views illustrating an operation of a piezoelectric element driving circuit according to the first embodiment.
Figure 7B:
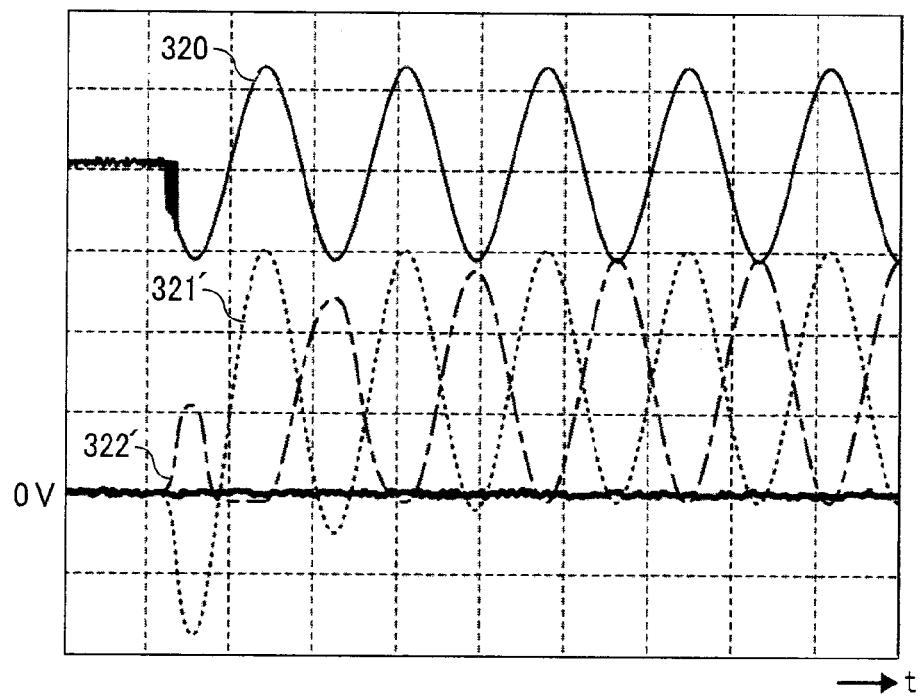

The operation in the circuit of FIG. 6 will be described with reference to FIGS. 7A and 7B. FIGS. 7A and 7B illustrate the simulation results of sine waves which are applied to the primary side of the transformer T1 and the waveform of a voltage which is applied to each of the piezoelectric elements C2 and C3. A sine wave 320 is an example of a signal which is input to the primary side of the transformer T1. Waveforms 321 and 321' are an example of the waveform of a voltage which is applied to the piezoelectric element C2, and waveforms 322 and 322' are an example of the waveform of a voltage which is applied to the piezoelectric element C3. In the sine wave 320, to avoid complexity, the position of 0 V is shifted.

FIG. 7A illustrates an example when the input of the sine wave 320 to the transformer T1 starts from the phase 0° of the sine wave. In this case, the voltage which is applied to each of the piezoelectric elements C2 and C3 is shifted only to the positive potential side simultaneously with the input of the sine wave 320 to the primary side, as illustrated on the leading side (left side) of the waveform 321 and the waveform 322. That is, this means that the voltage at the common connection point of the piezoelectric elements C2 and C3 is shifted only to the positive potential side.

FIG. 7B illustrates an example when the input of the sine wave 320 to the transformer T1 starts from the phase 270° of the sine wave. In this case, as illustrated on the head leading side of the waveform 321', the voltage which is applied to the piezoelectric element C2 is shifted to the negative potential side by half of the first cycle immediately after the input of the sine wave 320 to the primary side. In the next half wave, a change is made to a DC bias to the positive potential side.

As understood from FIGS. 7A and 7B, preferably, the sine wave which is input to the primary side of the transformer T1 is phase-controlled such that the output of the terminal 3 of the transformer T1 starts from the rising phase of the sine wave. As a specific example, when the polarity of the transformer T1 is set as illustrated in FIG. 6, phase control is performed such that the input of the sine wave to the primary side starts from the phase 0°. In the example of FIG. 6, it is possible to control the phase of the sine wave to be applied to the primary side of the transformer T1 by the signal data generator IC1, the sine wave converter IC2, or the like. It is also possible to suppress the negative potential at the time of inrush by controlling the rising amplitude to gradually increase when the input of the sine wave to the transformer T1 starts.

In the configuration of FIG. 6, even when the directions of the diodes D2 and D3 are reversed, the same effects can be obtained.

As described above, according to the first embodiment, it is possible to apply the entire DC bias to the output on the secondary side of the transformer T1 by using the electric charges which are accumulated in the capacitor C1 connected to the center tap 4 on the secondary side of the transformer T1. The sinusoidal signal which is generated on the secondary side of the transformer T1 is rectified and supplied to the capacitor C1. For this reason, the DC voltage which is half of the voltage across both extreme values of the sine wave is applied to the common connection point of the piezoelectric element C2 or C3. It is thus possible to obtain the DC bias such that the minimum voltage of the sinusoidal signal to be applied to the piezoelectric elements C2 and C3 becomes 0 V. Therefore, with a simple circuit configuration, it becomes possible to suppress deterioration of the piezoelectric elements C2 and C3 which require a directional application voltage.

The leakage prevention diode D1 is inserted between the center tap 4 of the transformer T1 and the capacitor C1. Thus, it is possible to respectively apply the driving signals by sine waves in reverse phases based on the common connection point of the piezoelectric elements C2 and C3 to the piezoelectric elements C2 and C3 with the positive or negative DC bias applied.

The diodes D1 and diode D2 for leakage prevention are connected to the common connection point through the electrodes on the same side. For this reason, it is possible to prevent a leak current generated in a cycle, in which the potential of the center tap 4 of the transformer T1 is lower than the potential of the capacitor C1 connected to the center tap 4 through the diode D1 at the common connection point of the piezoelectric elements C2 and C3, from affecting the DC bias. Thus, leakage to the center tap 4 is suppressed, excluding when the capacitor C1 is initially charged.

Second Embodiment

Next, a second embodiment of the invention will be described. Although in the first embodiment, a pair of piezoelectric elements C2 and C3 are driven with sine waves in reverse phases, in the second embodiment, a single piezoelectric element or a plurality of piezoelectric elements which are connected to each other in parallel with the directions defined by the bonded structure arranged are driven with a single sine wave.

Figure 8:
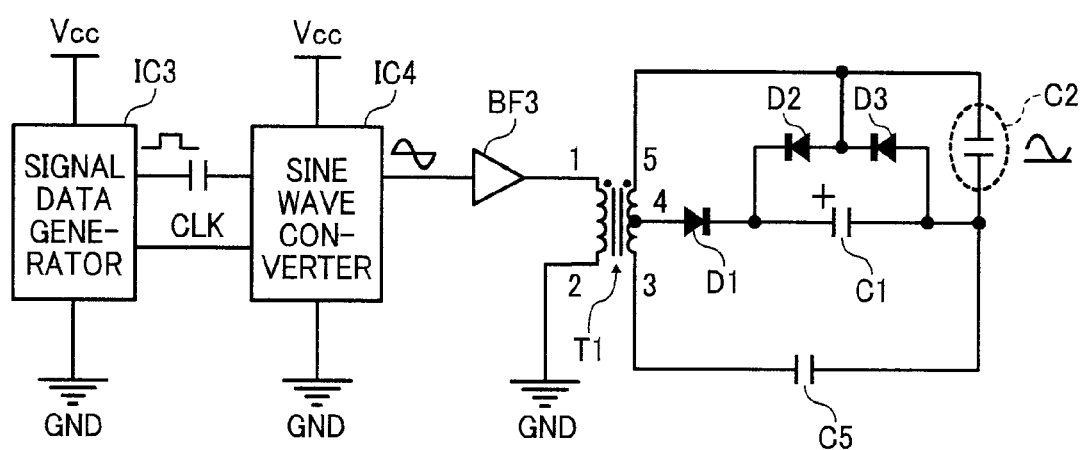
FIG. 8 is a circuit diagram of an example of a piezoelectric element driving circuit according to a second embodiment of the invention.

FIG. 8 illustrates an example of a piezoelectric element driving circuit of the second embodiment. In FIG. 8, the portions common to FIG. 6 described above are represented by the same reference numerals, and detailed description thereof will be omitted.

In FIG. 8, the configuration of the primary side of a transformer T1 is slightly different from the configuration illustrated in FIG. 6. A signal data generator IC3 generates a fundamental square wave and supplies the square wave to a sine wave converter IC4 through alternating-current coupling by a capacitor C5. The signal data generator IC3 generates a clock CLK by a square wave synchronized with the fundamental square wave and supplies the clock CLK to the sine wave converter IC4.

The sine wave converter IC4 is constituted by, for example, a switched capacitor (SWC) circuit and generates a sinusoidal signal from the fundamental square wave and the clock CLK supplied from the signal data generator IC3. The sinusoidal signal output from the sine wave converter IC4 is current-amplified to a current sufficient for driving the transformer T1 by a buffer circuit BF3 and input to a terminal 1 of the transformer T1. A terminal 2 of the transformer T1 is grounded.

The configuration of the primary side of the transformer T1 is not limited to the configuration of FIG. 8. That is, the configuration of the primary side of the transformer T1 illustrated in FIG. 6 described above may be applied to the second embodiment. Similarly, the configuration of the primary side of the transformer T1 illustrated in FIG. 8 may be applied to the piezoelectric element driving circuit of the first embodiment illustrated in FIG. 6.

In FIG. 8, the configuration of the secondary side of the transformer T1 is common to the configuration of FIG. 6 except that a capacitor C5 is inserted instead of the piezoelectric element C3 of FIG. 6. The capacitor C5 (first capacitor) is provided so that a terminal 3 of the transformer T1 can be connected to a common connection point of a piezoelectric element C2, a capacitor C1, and a diode D3 in an alternating-current (AC) connection manner.

The capacitor C5 has electrostatic capacitance sufficiently greater than that of the piezoelectric element C2. For example, the capacitor C5 has electrostatic capacitance which is about 100 times greater than the electrostatic capacitance of the piezoelectric element C2.

That is, in the configuration of FIG. 6 described above, substantially the same voltage needs to be applied to the piezoelectric elements C2 and C3. Thus, the piezoelectric elements C2 and C3 have substantially the same electrostatic capacitance. Meanwhile, in the second embodiment, preferably, the entire voltage of a sinusoidal signal on the secondary side of the transformer T1 is applied to the piezoelectric element C2. The electrostatic capacitance of the capacitor C5 is sufficiently greater than the electrostatic capacitance of the piezoelectric element C2, making it possible to apply substantially the entire voltage component (i.e., the voltage between the terminal 3 and the terminal 5 of the transformer T1) on the secondary side of the transformer T1 to the piezoelectric element C2.

It is possible to adjust the voltage of the sinusoidal signal to be applied to the piezoelectric element C2 by adjusting the electrostatic capacitance of the capacitor C5. Even when the electrostatic capacitance of the capacitor C5 is adjusted, the DC bias voltage to the piezoelectric element C2 is applied such that the lower limit value of the sinusoidal signal to be applied to the piezoelectric element C2 converges to about 0 V.

In the configuration of the second embodiment illustrated in FIG. 8, in the normal state, the entire potential on the secondary side of the transformer T1 is shifted to the positive potential side with respect to the potential of the center tap 4. Thus, the sinusoidal signal to be applied to the piezoelectric element C2 is applied as the signal of a voltage with a DC bias applied to the positive potential side by half of the amplitude of the sine wave.

The operation in the circuit of FIG. 8 will be schematically described with reference to FIGS. 9A to 9C and 10A to 10C. FIGS. 9A to 9C and 10A to 10C illustrate the simulation results when a sinusoidal signal with frequency of 1200 Hz and amplitude of ±2.1 V is input to the primary side of the transformer T1 of FIG. 8. When the turn ratio of the transformer T1 is 1:25, the output of the secondary side becomes 2.1 Vpp×2×25=105 Vpp.

Figure 9A:
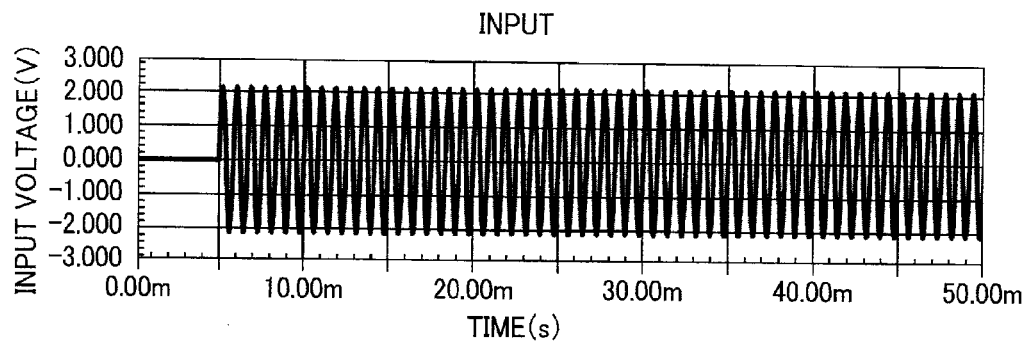
FIGS. 9A to 9C are schematic views illustrating an operation of a piezoelectric element driving circuit according to the second embodiment.
Figure 9B:
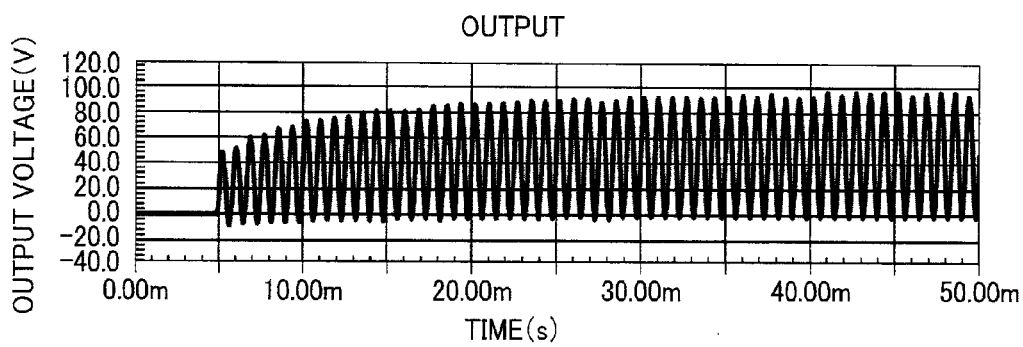
Figure 9C:
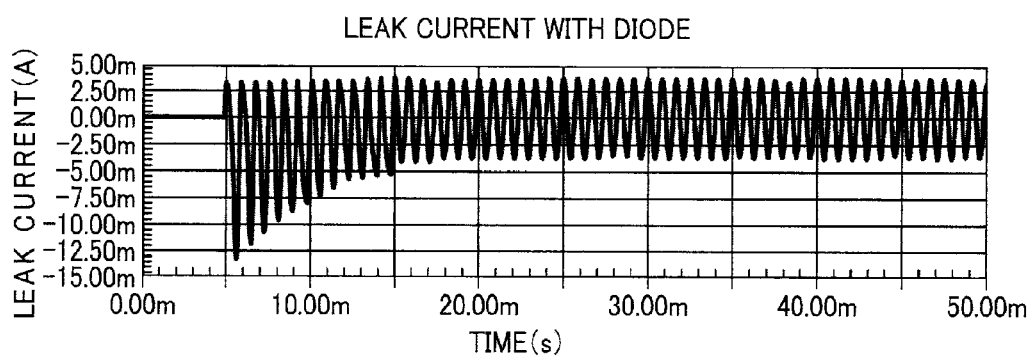

FIGS. 9A to 9C illustrate an example of a simulation result when there is no diode D1 for leakage prevention. FIG. 9A illustrates a sinusoidal signal which is input to the primary side of the transformer T1. FIG. 9B illustrates a voltage which is input to the piezoelectric element C2. The capacitor C5 has relatively great electrostatic capacitance, thus it takes a given time until a DC bias which is applied to the piezoelectric element C2 is stabilized, and during that time, the voltage which is applied to the piezoelectric element C2 gradually increases. After the DC bias is stabilized, the voltage which is applied to the piezoelectric element C2 is stabilized.

FIG. 9C illustrates a leak current which flows in the diode D1 of FIG. 8 when there is no diode D1 for leakage prevention. In this way, the maximum leak current flows immediately after the input of the sinusoidal signal to the primary side of the transformer T1, and as the DC bias is stabilized, the leak current decreases and is stabilized at a predetermined value.

Figure 10A:
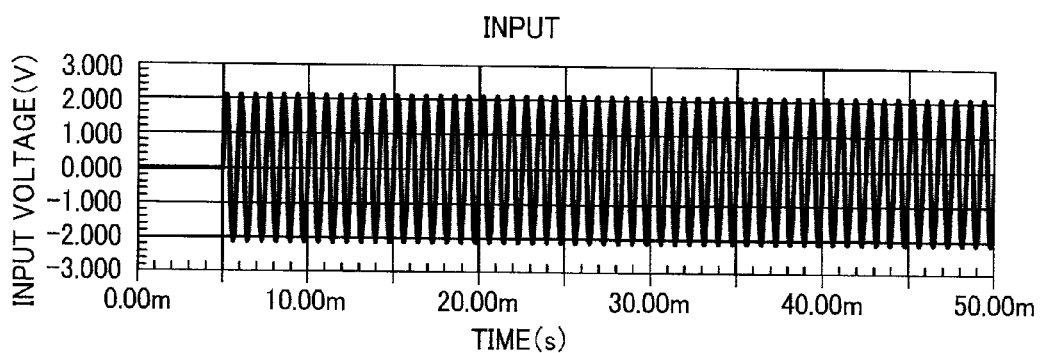
FIGS. 10A to 10C are schematic views illustrating an operation of a piezoelectric element driving circuit according to the second embodiment.
Figure 10B:
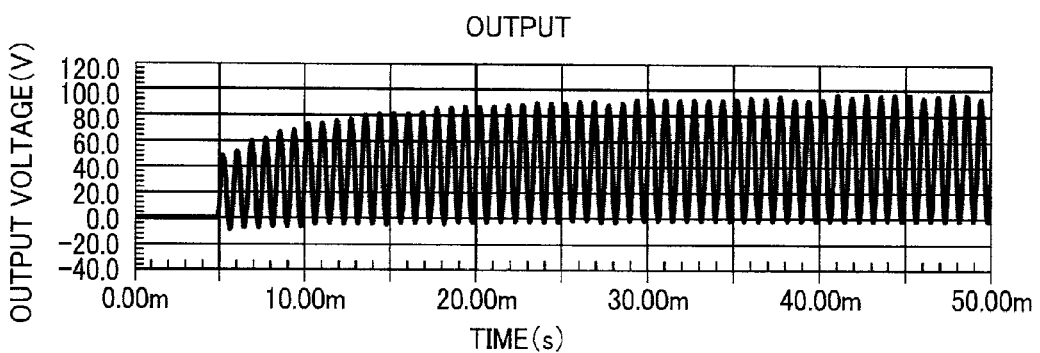
Figure 10C:
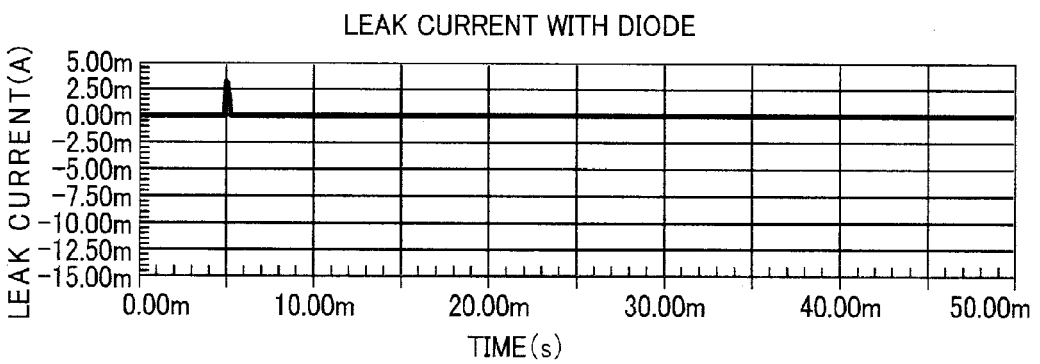

FIGS. 10A to 10C illustrate an example of a simulation result when there is the diode D1 for leakage prevention as illustrated in FIG. 8. FIG. 10A illustrates a sinusoidal signal which is applied to the primary side of the transformer T1. FIG. 10B illustrates a voltage which is applied to the piezoelectric element C2. As illustrated in FIG. 10B, the voltage which is applied to the piezoelectric element C2 when the diode D1 is inserted is also applied slightly to the negative potential side compared to the example of FIG. 9B described above. After the DC bias voltage is stabilized, the voltage which is applied to the piezoelectric element C2 is stabilized at a value close to 105 Vpp described above.

In the example of the first embodiment, the piezoelectric elements C2 and C3 divides the output voltage on the secondary side of the transformer T1 at a voltage ratio of about 1:1 of the sinusoidal component by electrostatic capacitance, and does not use great electrostatic capacitance, such as the capacitor C5 of the second embodiment. For this reason, as the sinusoidal signal is input to the primary side of the transformer T1, the DC bias is substantially instantaneously applied to the piezoelectric element C2 and C3, and the voltage which is applied to each of the piezoelectric elements C2 and C3 becomes stable in a very short time (not illustrated).

FIG. 10C illustrates a leak current which flows in the diode D1 for leakage prevention. In such a manner, the leak current is suppressed to substantially 0 V after a slight peak is generated immediately after the input of the sinusoidal signal to the primary side of the transformer T1 starts. Thus, it can be understood that the output on the secondary side of the transformer T1 is efficiently used in the piezoelectric element C2. As described in the first embodiment, high resistance may be inserted instead of the diode D1.

As described above, in the second embodiment, to effectively use the sinusoidal signal on the secondary side of the transformer T1, the capacitor C5 having sufficiently greater electrostatic capacitance than that of the piezoelectric element C2 is used at a position symmetrical to the piezoelectric element C2 with respect to the center tap 4 of the transformer T1. For this reason, it takes a certain amount of time until the DC bias to the piezoelectric element C2 is stabilized. However, as understood from FIG. 10B, the time for which the negative potential is applied to the piezoelectric element C2 is several tens ms (millisecond) at most, and there is no problem in driving the piezoelectric element C2.

In the real simulation result, in the configuration of the first embodiment illustrated in FIG. 6, the piezoelectric elements C2 and C3 have the same electrostatic capacitance such that the DC bias reaches the normal state in a very short time of 1 ms (not illustrated). In the configuration of the second embodiment illustrated in FIG. 8, the capacitor C5 has sufficiently greater electrostatic capacitance than that of the piezoelectric element C2, thus as illustrate in FIG. 10B, it takes a time of about 20 ms until the DC bias is in the normal state.

Through the servo operation described with reference to FIG. 4, in the application in which the driving conditions of the piezoelectric element C2, such as the amplitude of the sinusoidal signal, are frequently changed, it is effective to increase the driving ability of the buffer circuit BF3. In this case, it is preferable that the electrostatic capacitance of the capacitor C5 and the driving ability of the buffer circuit BF3 are determined in balance. Even the DC bias is transiently slightly biased to the negative potential side, if no rapid change occurs, there is no case where a high negative potential is obtained. Thus, it is possible to suppress biasing by setting the parameters of the circuit, causing no problems.

Figure 11:
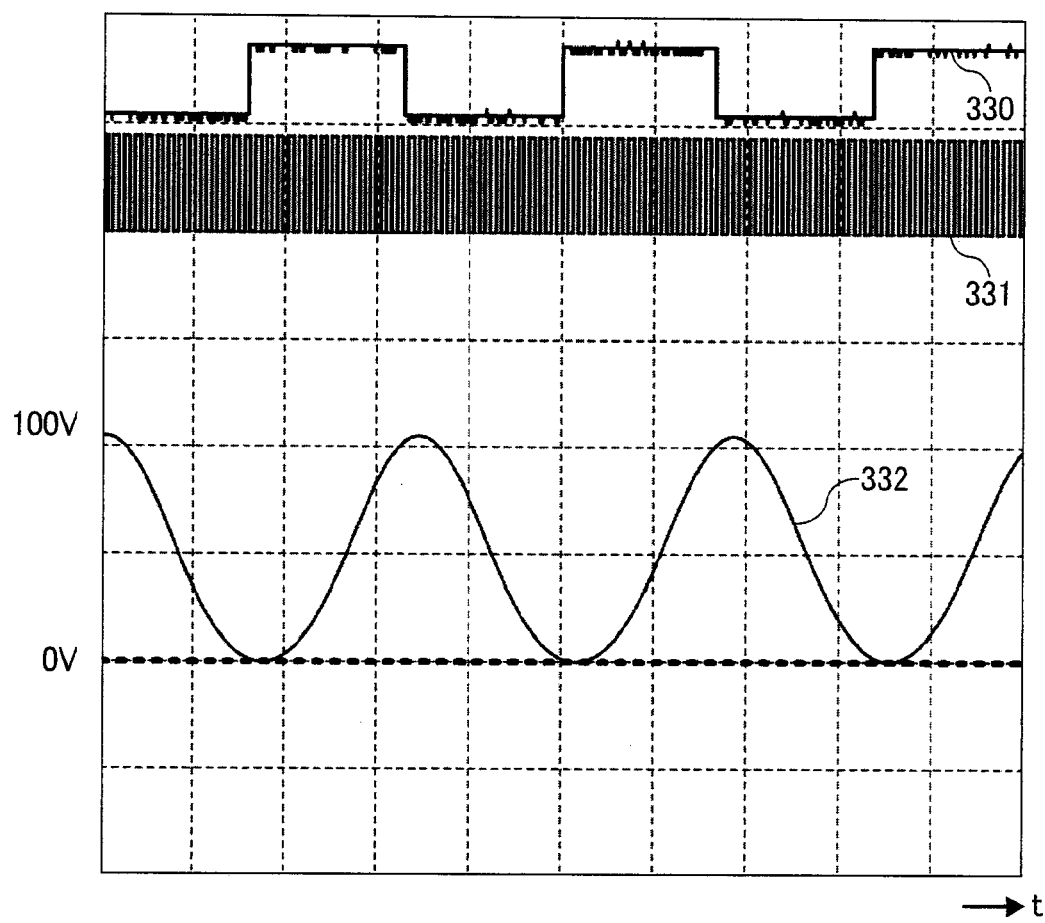
FIG. 11 is a schematic view of the simulation results of the waveform of a signal output from a signal data generator and the waveform of a voltage applied to a piezoelectric element.

FIG. 11 illustrates the simulation results of the waveform of a signal which is output from the signal data generator IC1 and the waveform of a voltage which is applied to the piezoelectric element C2. Waveforms 330 and 331 are respectively examples of the fundamental square wave and the clock CLK which are output from the signal data generator IC1. The fundamental square wave and the clock CLK are generated by hardware or by software under the control of a processor or the like in the signal data generator IC1. Referring to FIG. 11, the clock CLK has high frequency. Thus, in FIG. 11, the clock CLK is expressed to be spread.

A waveform 332 illustrates a sinusoidal voltage which is applied to the piezoelectric element C2 in the normal state. A sine wave is generated on the basis of the fundamental square wave and the clock CLK output from the signal data generator IC1 by the sine wave converter IC2, and the sine wave is boosted by the transformer T1 and becomes the sinusoidal voltage illustrated in the waveform 332. Referring to FIG. 11, the sinusoidal voltage has the minimum voltage of about 0 V while the peak voltage Vpp is about 105 V.

Figure 12A:
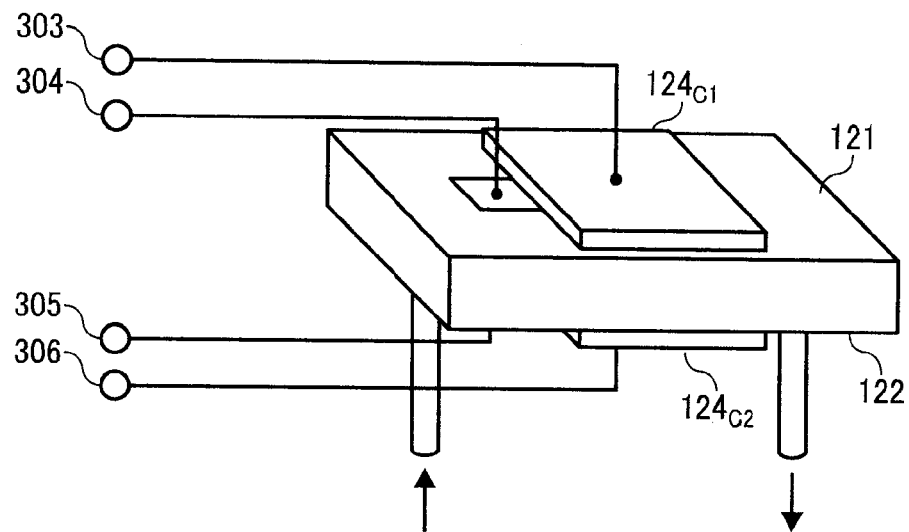
FIGS. 12A and 12B are schematic views of an example of the structure of a micropump that can be applied to the second embodiment.
Figure 12B:
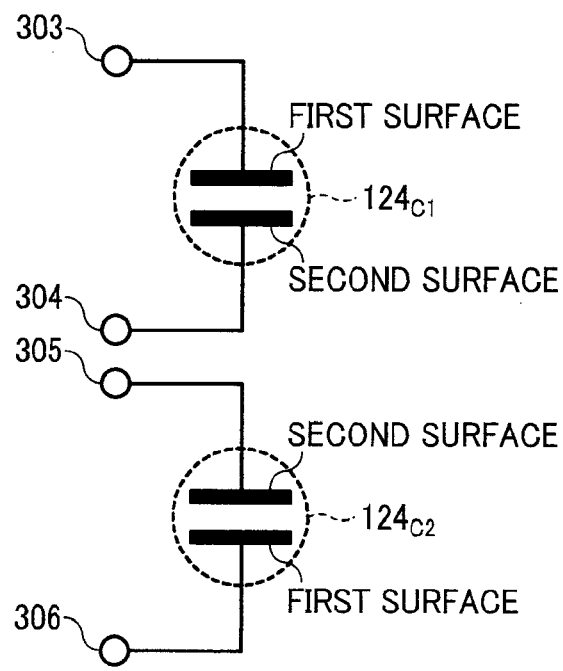

FIGS. 12A and 12B illustrate the structure of an example of the micropump 12 which can be applied to the second embodiment. In FIGS. 12A and 12B, the portions common to FIGS. 5A to 5C described above are represented by the same reference numerals, and detailed description thereof will be omitted. In this example, the piezoelectric element C2 in FIG. 8 is used through parallel connection. That is, in FIGS. 12A and 12B, a first piezoelectric element $124c_1$ and a second piezoelectric element $124c_2$ correspond to two piezoelectric elements C2 which are connected in parallel.

As illustrated in FIG. 12A, the first piezoelectric element $124c_1$ and the second piezoelectric element $124c_2$ are arranged on both surfaces of the pressure chamber 126 such that the first piezoelectric element $124c_1$ and the second piezoelectric element $124c_2$ vibrate in opposing directions when sinusoidal voltages in the same phase are applied. For example, the first piezoelectric element $124c_1$ and the second piezoelectric element $124c_2$ are respectively fixed on the first substrate 121 and the second substrate 122 such that the first surfaces or the second surfaces defined by the above-described bonded structure face each other.

As illustrated in FIG. 12B, the electrode on a first surface of the first piezoelectric element $124c_1$ is connected to a terminal 303, and the electrode on a second surface is connected to a terminal 304. The electrode on a second surface of the second piezoelectric element $124c_2$ is connected to a terminal 305, and the electrode of a first surface is connected to a terminal 306. The terminal 303 and the terminal 306 are connected to each other, and the terminal 304 and the terminal 305 are connected to each other. A connection point of the terminal 303 and the terminal 306 corresponds to one electrode of the piezoelectric element C2 in FIG. 8, and a connection point of the terminal 304 and the terminal 305 corresponds to the other electrode.

In such a manner, the first piezoelectric element $124c_1$ and the second piezoelectric element $124c_2$ are arranged in the pressure chamber 126 and connected to the circuit of FIG. 8 such that the second piezoelectric element $124c_2$ is also flexed inward of the pressure chamber 126 by a single sinusoidal voltage at the timing at which the first piezoelectric element $124c_1$ is flexed inward of the pressure chamber 126. Therefore, it is possible to increase the contraction ratio of the pressure chamber 126 in the contraction state compared to a case where a piezoelectric element is provided on one surface of the pressure chamber 126.

In the configuration of FIG. 8, even when the directions of the diodes D2 and D3 are reversed, the same effects can be obtained.

As described above, according to the second embodiment, similarly to the foregoing first embodiment, it is possible to apply the entire DC bias to the output on the secondary side of the transformer T1 by using the electric charges accumulated in the capacitor C1 connected to the center tap 4 on the secondary side of the transformer T1. For this reason, with a simple circuit configuration, it becomes possible to suppress deterioration of the piezoelectric element C2 which requires a directional application voltage.

According to the embodiments of the invention, it becomes possible to enable driving of an actuator constituted by a piezoelectric element using sine waves for a long time.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A piezoelectric element driving circuit comprising:
   a signal generation unit that generates a sinusoidal signal;
   a transformer that receives the sinusoidal signal generated by the signal generation unit on a primary side, and includes a first terminal and a second terminal on a secondary side and a third terminal led from a midpoint between the first terminal and the second terminal;
   a piezoelectric element including a first electrode connected to the first terminal;
   a first capacitor including a first electrode connected to a second electrode of the piezoelectric element and a second electrode connected to the second terminal;
   a second capacitor including a first electrode connected to a connection point of the second electrode of the piezoelectric element and the first electrode of the first capacitor;
   a first diode including a cathode connected to a second electrode of the second capacitor and an anode connected to the third terminal;
   a second diode including a cathode connected to a connection point of the second electrode of the second capacitor and the cathode of the first diode, and an anode connected to a connection point of the first electrode of the piezoelectric element and the first terminal; and
   a third diode including a cathode connected to the connection point of the first electrode of the piezoelectric element, the first terminal, and the anode of the second diode, and an anode connected to the connection point of the second electrode of the piezoelectric element, the first electrode of the first capacitor, and the first electrode of the second capacitor.

2. The piezoelectric element driving circuit according to claim 1, wherein the first capacitor is another piezoelectric element that substantially equal in electrostatic capacitance to the piezoelectric element.

3. The piezoelectric element driving circuit according to claim 1, wherein electrostatic capacitance of the first capacitor is sufficiently greater than electrostatic capacitance of the piezoelectric element.

4. The piezoelectric element driving circuit according to claim 1, wherein the signal generation unit generates the sinusoidal signal through phase control such that output of the first terminal starts from a rising phase of a sine wave.

5. The piezoelectric element driving circuit according to claim 1, wherein a high resistance is used as the first diode.

6. A pump comprising:
   a signal generation unit that generates a sinusoidal signal;
   a transformer that receives the sinusoidal signal generated by the signal generation unit on a primary side, and includes a first terminal and a second terminal on a secondary side and a third terminal led from a midpoint between the first terminal and the second terminal;
   a piezoelectric element including a first electrode connected to the first terminal;

a first capacitor including a first electrode connected to a second electrode of the piezoelectric element and a second electrode connected to the second terminal;

a second capacitor including a first electrode connected to a connection point of the second electrode of the piezoelectric element and the first electrode of the first capacitor;

a first diode including a cathode connected to a second electrode of the second capacitor and an anode connected to the third terminal;

a second diode including a cathode connected to a connection point of the second electrode of the second capacitor and the cathode of the first diode, and an anode connected to a connection point of the first electrode of the piezoelectric element and the first terminal;

a third diode including a cathode connected to the connection point of the first electrode of the piezoelectric element, the first terminal, and the anode of the second diode, and an anode connected to the connection point of the second electrode of the piezoelectric element, the first electrode of the first capacitor, and the first electrode of the second capacitor; and a space a volume of which changes by driving of the piezoelectric element, the space including an inlet and an outlet of a fluid.

* * * * *